(12) United States Patent
Kang

(10) Patent No.: US 7,694,263 B2
(45) Date of Patent: Apr. 6, 2010

(54) METHOD OF WIRING DATA TRANSMISSION LINES AND PRINTED CIRCUIT BOARD ASSEMBLY WIRED USING THE METHOD

(75) Inventor: Yong Jin Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 824 days.

(21) Appl. No.: 11/491,073

(22) Filed: Jul. 24, 2006

(65) Prior Publication Data
US 2007/0083836 A1  Apr. 12, 2007

(30) Foreign Application Priority Data
Sep. 22, 2005  (KR) ............... 10-2005-0088187

(51) Int. Cl.
*G06F 17/50*  (2006.01)
*H05K 1/18*  (2006.01)

(52) U.S. Cl. .............. 716/13; 716/14; 716/15; 716/16; 361/719; 361/736; 361/748; 361/761

(58) Field of Classification Search ............ 716/13, 716/14, 15, 16; 361/719, 736, 748, 761
See application file for complete search history.

(56) References Cited

U.S. PATENT DOCUMENTS

| | | | | |
|---|---|---|---|---|
| 5,012,389 A | * | 4/1991 | Perry | ............. 361/679.31 |
| 5,367,480 A | * | 11/1994 | Matsumiya | ............. 365/63 |
| 5,583,745 A | * | 12/1996 | Uwabo et al. | ............. 361/679.32 |
| 5,625,563 A | * | 4/1997 | Rostoker et al. | ............. 716/2 |
| 5,729,467 A | * | 3/1998 | Katsumata et al. | ............. 716/15 |
| 6,178,494 B1 | * | 1/2001 | Casselman | ............. 712/37 |
| 6,202,110 B1 | * | 3/2001 | Coteus et al. | ............. 710/301 |
| 6,310,781 B1 | * | 10/2001 | Karam | ............. 361/764 |
| 6,374,394 B1 | * | 4/2002 | Camporese et al. | ............. 716/9 |
| 6,392,897 B1 | * | 5/2002 | Nakase et al. | ............. 361/785 |
| 6,791,843 B1 | * | 9/2004 | Dobbs et al. | ............. 361/758 |
| 7,397,320 B1 | * | 7/2008 | Bokhari | ............. 333/1 |
| 2002/0144227 A1 | * | 10/2002 | Das et al. | ............. 716/12 |

FOREIGN PATENT DOCUMENTS

JP  2004-199608  7/2004

\* cited by examiner

*Primary Examiner*—Phallaka Kik
(74) *Attorney, Agent, or Firm*—Stanzione & Kim, LLP

(57) ABSTRACT

A method of wiring data transmission lines between a CPU including CPU data pins identified by a set of pin numbers and a DRAM including DRAM data pins also identified by the set of pin numbers, the method including connecting the CPU data pins to the DRAM data pins with data transmission lines including unit-bit data transmission lines so that the unit-bit data transmission lines do not cross each other and without matching the pin numbers of the CPU data pins to the pin numbers of the DRAM data pins.

24 Claims, 4 Drawing Sheets

METHOD OF WIRING DATA TRANSMISSION LINES AND PRINTED CIRCUIT BOARD ASSEMBLY WIRED USING THE METHOD

CROSS-REFERENCE TO RELATED APPLICATION

This application claims the benefit of Korean Patent Application No. 2005-88187, filed on Sep. 22, 2005 in the Korean Intellectual Property Office, the disclosure of which is incorporated herein by reference.

BACKGROUND OF THE INVENTION

1. Field of the Invention

An aspect of the present invention relates to a method of wiring data transmission lines, and more particularly to a method of wiring data transmission lines between a CPU and an SDRAM.

2. Description of the Related Art

Printed circuit boards are substrates on which chips or other electronic components are mounted. Printed circuit boards are made of reinforced fiberglass or plastic, and have a copper circuit that connects the components to each other. The printed circuit board having the most important role in a system is typically referred to as a main board or a motherboard, and other printed circuit boards having lesser roles that are inserted into slots of the main board are typically referred to as boards or cards. Although early printed circuit boards were designed for mounting individual components thereon, recent printed circuit boards have been designed for mounting very large-scale integration (VLSI) integrated circuits thereon.

When producing a printed circuit board, a thin copper film adhered to the reinforced fiberglass or plastic substrate is coated with a photoresist. The photoresist is illuminated with light through a film having a circuit pattern thereon to form a latent image of the circuit pattern on the photoresist. The latent image is developed, and the portions of the photoresist not forming part of the circuit pattern are dissolved and washed away. The substrate is immersed into an etching bath, and portions of the copper film not protected by the remaining photoresist are etched away, thereby forming the same circuit pattern on the copper film as the circuit pattern on the film.

The main board of a computer has a connector that is used to connect peripheral modules to a bus. In general, the main board has integrated circuits such as a CPU, memory devices, a system controller, and the like mounted thereon. The CPU, the memory devices, the system controller, and the like perform various data processing operations to perform commands. To enable this, data transmission lines are connected between the integrated circuits to transmit and receive large amounts of data.

Representative examples of data transmission lines include data transmission lines between the CPU and the memory devices. For serial data transmission, data can be transmitted through only one or two data transmission lines, whereas for parallel data transmission, data is generally transmitted on a byte-by-byte basis (where, for example, one byte includes eight bits) through a number of data transmission lines corresponding to the number of bits in one byte.

Because of data mapping and consistency in wiring a number of data transmission lines between the CPU and the memory devices, wiring is frequently performed to match pin numbers of data input and output terminals of the CPU to pin numbers of data input and output terminals of the memory devices.

However, when wiring the data transmission lines after matching the pin numbers, crossing of the data transmission lines inevitably occurs due to the presence of other components mounted around the CPU and the memory devices. As a result of this, the data transmission lines are bypassed to a rear side of the substrate through via holes to prevent short circuit of the data transmission lines caused by the crossing of the data transmission lines.

However, the via holes cause harmonic waves, i.e., noise, and thus negatively influence reliability of data transmission. In addition, bypassing of the data transmission lines through the via holes causes an increase in length of some unit-bit data transmission lines (i.e., data transmission lines corresponding to individual bits of a data transmission unit of one byte), resulting in non-uniform data transmission of the bits within one byte. In addition, when stacking a plurality of substrates, an impedance difference between the substrates can cause other problems.

SUMMARY OF THE INVENTION

An aspect of the invention is to provide a method of wiring data transmission lines between a CPU and an SDRAM that can ensure reliability of data transmission by wiring the data transmission lines so they do not cross each other based on characteristics of the SDRAM.

In accordance with one aspect of the invention, there is provide a method of wiring data transmission lines between a CPU including CPU data pins identified by a set of pin numbers and a DRAM including DRAM data pins also identified by the set of pin numbers, the method including connecting the CPU data pins to the DRAM data pins with data transmission lines including unit-bit data transmission lines so that the unit-bit data transmission lines do not cross each other and without matching all of the pin numbers of the CPU data pins to all of the pin numbers of the DRAM data pins.

In accordance with an aspect of the invention, at least some of the unit-bit data transmission lines may constitute data transmission lines of a single unit byte with respect to the CPU without regard to whether the at least some of the unit-bit data transmission lines that do not cross each other constitute part of data transmission lines of two or more unit bytes with respect to the DRAM.

In accordance with another aspect of the invention, there is provided a method of wiring data transmission lines between a CPU including CPU data pins identified by a set of pin numbers and an SDRAM including SDRAM data pins also identified by the set of pin numbers, the method including connecting the CPU data pins to the SDRAM data pins with data transmission lines including unit-bit data transmission lines so that the unit-bit data transmission lines do not cross each other and without matching all of the pin numbers of the CPU data pins to all of the pin numbers of the SDRAM data pins.

In accordance with an aspect of the invention, at least some of the unit-bit data transmission lines that do not cross each other may constitute data transmission lines of a single unit byte with respect to the CPU without regard to whether the at least some of the unit-bit data transmission lines that do not cross each other constitute part of data transmission lines of two or more unit bytes with respect to the SDRAM.

In accordance with another aspect of the invention, there is provided a method of wiring data transmission lines between a CPU including CPU data pins having a first arrangement and a DRAM including DRAM data pins having a second arrangement different from the first arrangement, the method including connecting the CPU data pins having the first arrangement to the DRAM data pins having the second arrangement different from the first arrangement with data transmission lines so that none of the data transmission lines crosses any other one of the data transmission lines.

In accordance with another aspect of the invention, a printed circuit board assembly includes a printed circuit board; a controller mounted on a surface of the printed circuit board, the controller including controller data pins having a first arrangement; a memory mounted on the surface of the printed circuit board on which the controller is mounted, the memory including memory data pins having a second arrangement different from the first arrangement; and data transmission lines connecting the controller data pins to the memory data pins so that none of the data transmission lines crosses any other one of the data transmission lines, the data transmission lines being provided only on the surface of the printed circuit board on which the controller and the memory are mounted.

Additional aspects and/or advantages of the invention will be set forth in part in the description which follows and, in part, will be obvious from the description or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
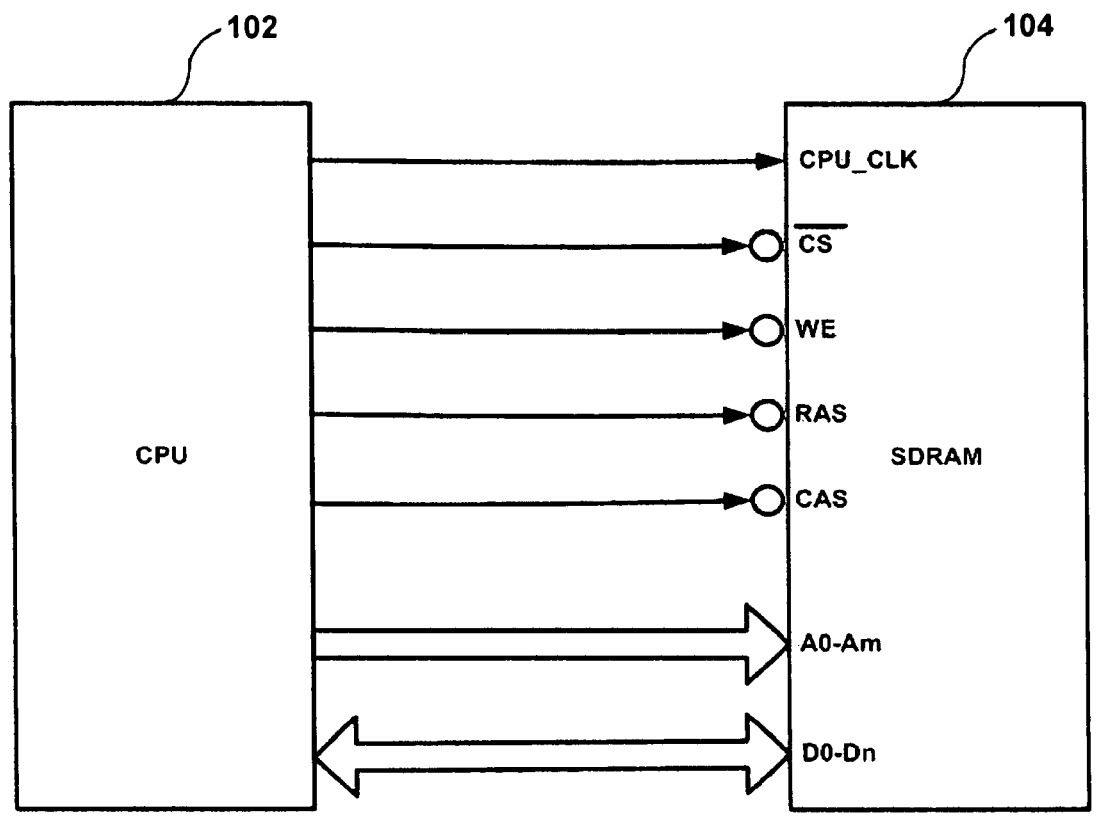
FIG. 1 is a diagram illustrating a connection between a CPU and an SDRAM.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a diagram illustrating a connection between a CPU 102 and an SDRAM 104. An SDRAM is one type of DRAM. As shown in FIG. 1, the CPU 102 and the SDRAM 104 are connected through lines for various control signals, address signals, and data signals. The control signals transmitted from the CPU 102 to the SDRAM 104 include CPU_CLK (CPU Clock), CS bar (Chip Select bar), WE (Write Enable), RAS (Row Address Strobe), CAS (Column Address Strobe), etc., and the address signals and the data signals are transmitted through address lines A0-Am and data lines D0-Dn, where n can be 7, corresponding to one 8-bit byte of data, or 15, corresponding to two 8-bit bytes of data, or 23, corresponding to three 8-bit bytes of data, or 31, corresponding to four 8-bit bytes of data, etc.

Figure 2:
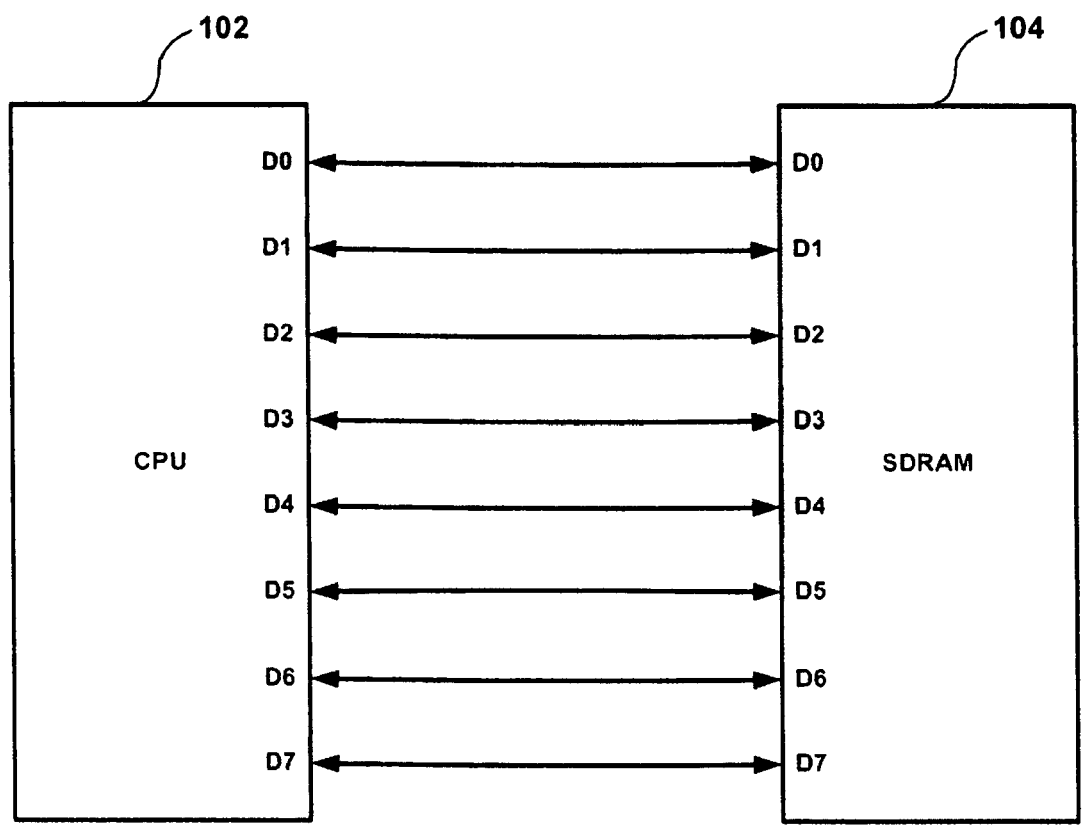
FIG. 2 is a diagram illustrating unit-byte data transmission lines connected between the CPU and the SDRAM shown in FIG. 1 when matching pin numbers thereof.

FIG. 2 is a diagram illustrating unit-byte data transmission lines connected between the CPU 102 and the SDRAM 104 of FIG. 1 when matching pin numbers. The data input and output terminals of the CPU 102 and the SDRAM 104 are laid out in the same order, i.e., D0, D1, D2, D3, D4, D5, D6, and D7. D0, D1, D2, D3, D4, D5, D6, and D7 represent data bits having different degrees of significance, with D0 typically representing a least significant data bit representing $2^0=1$ and D7 representing a most significant data bit representing $2^7=127$. As shown in FIG. 2, ideal wiring of data transmission lines is performed so that the data transmission lines of respective unit bits constituting a single unit byte do not cross each other in a state wherein pin numbers of data input and output terminals of the CPU 102 are one-to-one matched to pin numbers of data input and output terminals of the SDRAM 104. That is, the pin D0 of the CPU 102 is connected to the pin D0 of the SDRAM 104, the pin D1 of the CPU 102 is connected to the pin D1 of the SDRAM 104, etc. However, in practice, it is difficult to perform ideal wiring without crossing of the data transmission lines as shown in FIG. 2 due to the presence of other circuit components mounted between the CPU 102 and the SDRAM 104.

Figure 3:
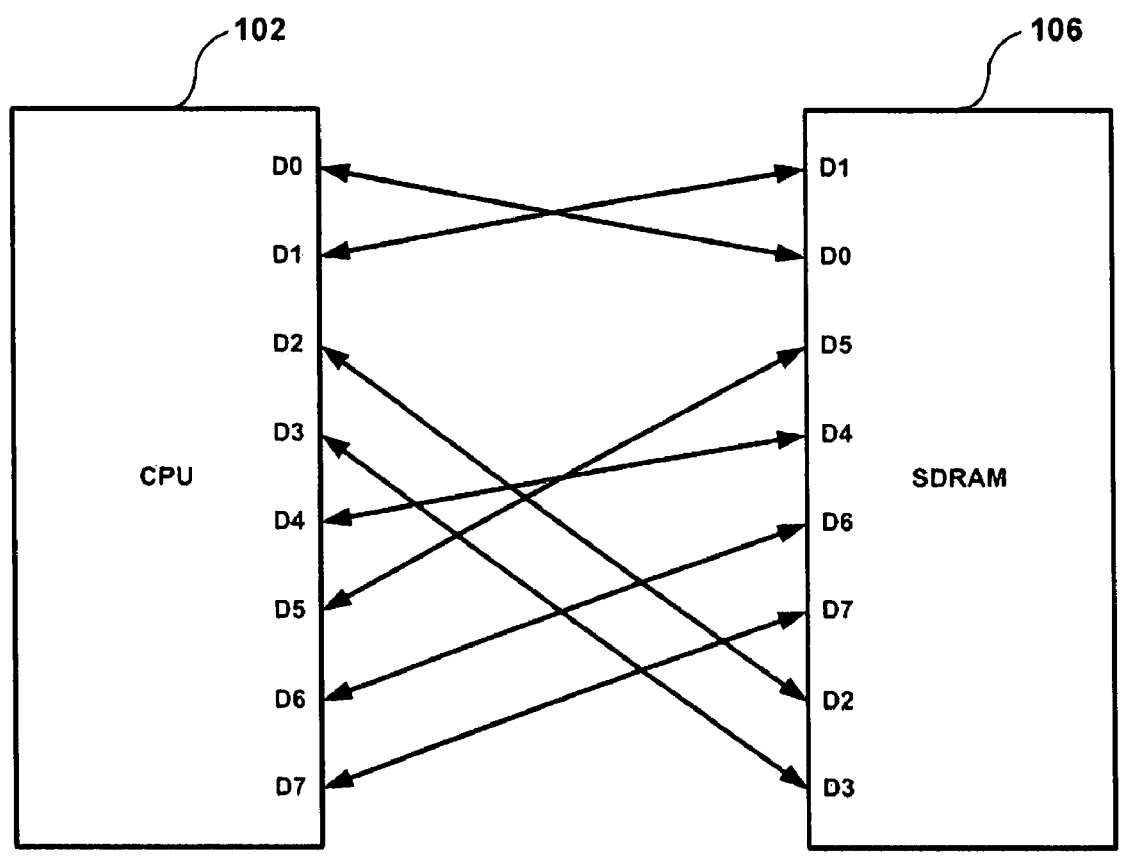
FIG. 3 is a diagram illustrating crossing of the unit-byte data transmission lines connected between the CPU shown in FIGS. 1 and 2 and an SDRAM having a different data pin arrangement than the SDRAM shown in FIGS. 1 and 2 when matching pin numbers thereof.

FIG. 3 is a diagram illustrating crossing of the unit-byte data transmission lines connected between the CPU 102 shown in FIGS. 1 and 2 and an SDRAM 106 having a different data pin arrangement than the SDRAM 104 shown in FIGS. 1 and 2 when matching pin numbers. The data input and output terminals of the SDRAM 106 are laid out differently than the data input and output terminals of the CPU 102 and the SDRAM 104 shown in FIGS. 1 and 2. That is, the data input and output terminals of the CPU 102 and the SDRAM 104 are laid out in the order D0, D1, D2, D3, D4, D5, D6, and D7, while the data input and output terminals of the SDRAM 106 are laid out in the order D1, D0, D5, D4, D6, D7, D2, and D3. Thus, FIG. 3 illustrates a case wherein crossing of the unit-bit data transmission lines inevitably occurs as a result of the different pin layouts when matching the pin numbers of the CPU 102 to the pin numbers of the CPU 106, i.e., when the pin D0 of the CPU 102 is connected to the pin D0 of the SDRAM 106, the pin D1 of the CPU 102 is connected to the pin D1 of the SDRAM 106, etc.

As shown in FIG. 3, if a requirement for matching the pin numbers of the data input and output terminals of the CPU 102 to the pin numbers of the data input and output terminals of the SDRAM 106 comes first, the crossing of unit-bit data transmission lines inevitably occurs as a result of the different pin layouts of the CPU 102 and the SDRAM 106, so that it is necessary to form via holes to avoid the crossing of the unit-bit data transmission lines.

Figure 4:
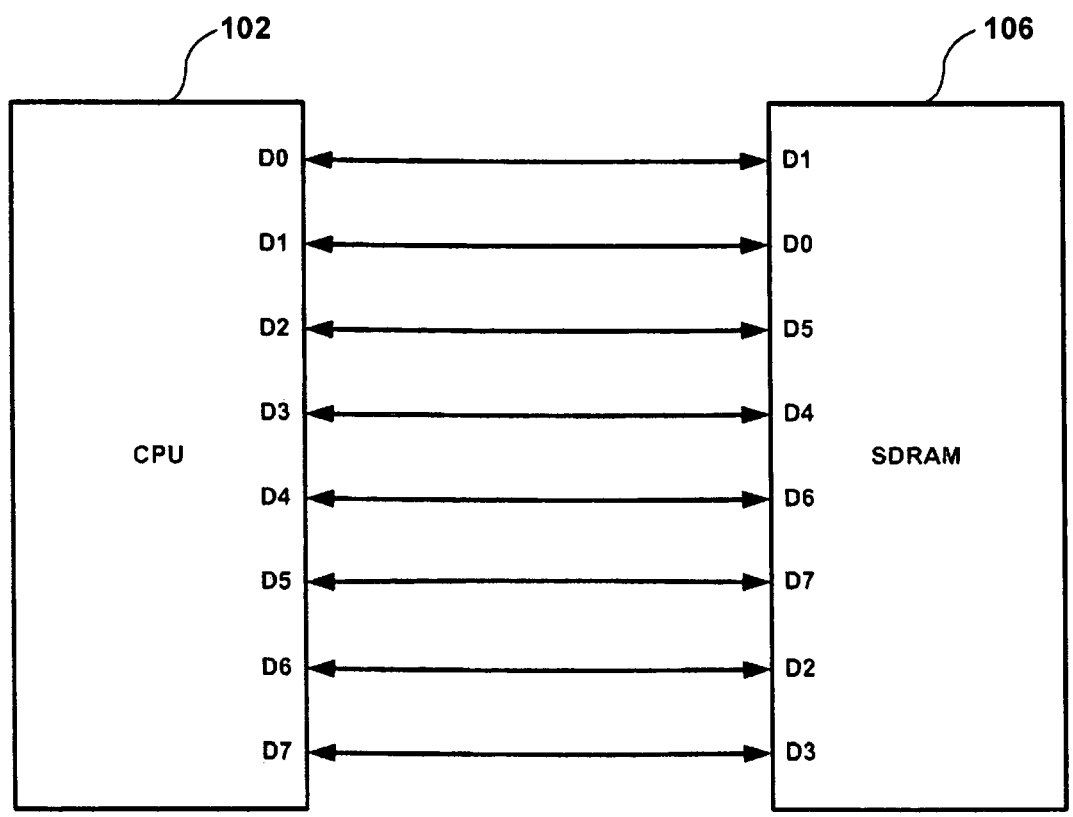
FIG. 4 is a diagram illustrating unit-byte data transmission lines connected between the CPU shown in FIGS. 1, 2, and 3 and the SDRAM shown in FIG. 3 in accordance with an embodiment of the present invention.

FIG. 4 is a diagram illustrating unit-byte data transmission lines connected between the CPU 102 shown in FIGS. 1, 2, and 3 and the SDRAM 106 shown in FIG. 3 in accordance with an embodiment of the present invention. As shown in FIG. 4, by eliminating the requirement that the pin numbers of the data input and output terminals of the CPU 102 be one-to-one matched to the pin numbers of the data input and output terminals of the SDRAM 106, the unit-bit data transmission lines can be connected so they do not cross each other, thereby avoiding the problems caused by bypassing the data transmission lines to the rear of the substrate through via holes.

Thus, as shown in FIG. 4, crossing of the unit-bit data transmission lines can be avoided by connecting the pin D0 of the CPU 102 to the pin D1 of the SDRAM 106, connecting the pin D1 of the CPU 102 to the pin D0 of the SDRAM 106, connecting the pin D2 of the CPU 102 to the pin D5 of the SDRAM 106, connecting the pin D3 of the CPU 102 to the pin D4 of the SDRAM 106, connecting the pin D4 of the CPU 102 to the pin D6 of the SDRAM 106, connecting the pin D5 of the CPU 102 to the pin D7 of the SDRAM 106, connecting the pin D6 of the CPU 102 to the pin D2 of the SDRAM 106, and connecting the pin D7 of the CPU 102 to the pin D3 of the SDRAM 106.

In general, when connecting two memory devices together, it is necessary to match the pin numbers of both memory devices to each other due to data mapping. However, even though the pin numbers are not one-to-one matched in the case of connecting the CPU 102 to the SDRAM 106 as shown in FIG. 4, there occurs no problem in data input and output due to the characteristics of the SDRAM 106.

That is, the SDRAM 106 operates to store data in one-byte units (where, for example, one byte includes eight bits), and has a structure to merely store whatever data is input through the data input and output terminals. It is not necessary to perform additional data mapping of the data input to the SDRAM 106 using an external controller, and thus there occurs no problem in storing and reading the data on a byte-by-byte basis, even if there is no consistency of the pin numbers through which respective data bits are input or output. That is, the order in which the data bits are stored in the SDRAM 106 makes no difference as long as an external device storing and reading the data bits knows the order in which the data bits are stored. As such, there is greater independence and variety in the location and direction of the data transmission lines, making it possible to avoid circuit components mounted between the CPU 102 and the SDRAM 106.

For example, the CPU 102 outputs data bits in the order D0D1D2D3D4D5D6D7. When these data bits are stored in the SDRAM 106 connected to the CPU 102 as shown in FIG. 4, they are stored in an incorrect order D1D0D5D4D6D7D2D3 in the SDRAM 106 from the point of view of the SDRAM 106. However, from the point of view of the CPU 102, they are stored in the correct order D0D1D2D3D4D5D6D7, which is all that matters. Thus, when the CPU 102 reads these data bits from the SDRAM 106, it reads the data bits in the correct order D0D1D2D3D4D5D6D7.

As apparent from the above description, the data transmission lines are connected between the CPU 102 and the SDRAM 106 without crossing of the data transmission lines and without matching the pin numbers of the data pins of the CPU 102 to the pin numbers of the data pins of the SDRAM 106, i.e., without taking into account the arrangements of the data pins of the CPU 102 and the SDRAM 106, thereby avoiding the necessity of forming via holes and increasing the length of the data transmission lines to bypass the data transmission lines to the rear of the substrate through the via holes, thereby enhancing reliability of data transmission.

Although particular arrangements of the data pins of the CPU 102 and the SDRAM 106 are shown in FIG. 4, the invention is not limited to these arrangements, but includes any arrangements of the data pins as long as the order of the data pins of the CPU 102 is different from the order of the data pins of the SDRAM 106 so that all of the pin numbers of the data pins of the CPU 102 are not matched to all of the pin numbers of the data pins of the SDRAM 106. For example, the data pins of the CPU 102 can be arranged in an order D3D7D2D6D5D0D1D4 and the data pins of the if the SDRAM 106 can be arranged in an order D3D7D2D6D5D0D4D1. In these arrangements, the pin numbers D0, D2, D3, D5, D6, and D7 of the data pins of the CPU 102 are matched to the pin numbers D0, D2, D3, D5, D6, and D7 of the data pins of the SDRAM 106, but the pin numbers D1 and D4 of the data pins of the CPU 102 are not matched to the pin numbers D1 and D4 of the SDRAM 106.

Furthermore, although the CPU 102 and the SDRAM 106 are shown in FIG. 4 as having eight data pins D0-D7 corresponding to one 8-bit byte, the invention is not limited to this, but is applicable to CPUs and SDRAMs having 16 data pins D0-15 corresponding to two 8-bit bytes, or 24 data pins D0-D23 corresponding to three 8-bit bytes, or 32 data pins D0-D31 corresponding to four 8-bit bytes, etc. For CPUs and SDRAMs having 16 or more data pins corresponding to two or more 8-bit bytes, the data transmission lines can connect data pins belonging to different bytes.

For example, if a CPU and an SDRAM each have sixteen data pins D0-D15 corresponding to two 8-bit bytes, a first data transmission line may connect data pin D1 of the CPU belonging to a first byte D0-D7 to data pin D5 of the SDRAM belonging to the first byte D0-D7, and a second data transmission line may connect pin D2 of the CPU belonging to the first byte D0-D7 to pin D13 of the SDRAM belonging to a second byte D8-D15. However, with respect to the CPU, the first and second data transmission lines are part of data transmission lines constituting a single unit byte, i.e., the first byte D0-D7, even though with respect to the SDRAM the first and second data transmission lines are part of data transmission lines constituting two unit bytes, i.e., the first byte D0-D7 and the second byte D8-D15.

The SDRAM 106 shown in FIG. 4 may be any type of SDRAM, such as SDR SDRAM, DDR SDRAM, DDR2 SDRAM, DDR3 SDRAM, GDDR SDRAM, GDDR2 SDRAM, GDDR3 SDRAM, Mobile SDRAM, Mobile DDR SDRAM, or Mobile DDR2 SDRAM. Also, the present invention is not limited to SDRAM, but is applicable to any DRAM, such as RDRAM, XDR DRAM, XDR-II DRAM, NetRam, RLDRAM, or RLDRAM II, to other types of RAM such as CellularRAM, and to any other type of memory in which it is not necessary to perform additional data mapping of data input to the memory using an external controller.

Although the invention has been described in terms of a CPU being connected to a memory, the invention is not limited to such a configuration, but is applicable to any configuration in which a controller is connected to a memory.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing a printed circuit board (PCB) assembly including data transmission lines wired between a central processing unit (CPU) comprising CPU data pins identified by a set of pin numbers and a dynamic random access memory (DRAM) comprising DRAM data pins also identified by the set of pin numbers, the method comprising:
   connecting the CPU data pins to the DRAM data pins on the PCB assembly with the data transmission lines comprising unit-bit data transmission lines so that the unit-bit data transmission lines do not cross each other and without matching all of the pin numbers of the CPU data pins to all of the pin numbers of the DRAM data pins.

2. The method of claim 1, wherein the connecting of the CPU data pins to the DRAM data pins comprises respectively connecting at least two of the CPU data pins to at least two of the DRAM data pins with respective ones of the unit-bit data transmission lines so that the pin numbers of the at least two of the CPU data pins do not match the pin numbers of respective ones of the at least two of the DRAM data pins.

3. The method of claim 1, wherein at least some of the unit-bit data transmission lines that do not cross each other constitute data transmission lines of a single unit byte with respect to the CPU without regard to whether the at least some of the unit-bit data transmission lines that do not cross each other constitute part of data transmission lines of two or more unit bytes with respect to the DRAM.

4. A method of manufacturing a printed circuit board (PCB) assembly including data transmission lines wired between central processing unit (CPU) comprising CPU data pins identified by a set of pin numbers and synchronous dynamic random access memory (SDRAM) comprising SDRAM data pins also identified by the set of pin numbers, the method comprising:
connecting the CPU data pins to the SDRAM data pins on the PCB assembly with the data transmission lines comprising unit-bit data transmission lines so that the unit-bit data transmission lines do not cross each other and without matching all of the pin numbers of the CPU data pins to all of the pin numbers of the SDRAM data pins.

5. The method of claim 4, wherein the connecting of the CPU data pins to the SDRAM data pins comprises respectively connecting at least two of the CPU data pins to at least two of the SDRAM data pins with respective ones of the unit-bit data transmission lines so that the pin numbers of the at least two of the CPU data pins do not match the pin numbers of respective ones of the at least two of the SDRAM data pins.

6. The method of claim 4, wherein at least some of the unit-bit data transmission lines that do not cross each other constitute data transmission lines of a single unit byte with respect to the CPU without regard to whether the at least some of the unit-bit data transmission lines that do not cross each other constitute part of data transmission lines of two or more unit bytes with respect to the SDRAM.

7. A method of manufacturing a printed circuit board (PCB) assembly including data transmission lines wired between central processing unit (CPU) comprising CPU data pins having a first arrangement and a dynamic random access memory (DRAM) comprising DRAM data pins having a second arrangement different from the first arrangement, the method comprising:
connecting the CPU data pins having the first arrangement to the DRAM data pins having the second arrangement different from the first arrangement on the PCB assembly with the data transmission lines so that none of the data transmission lines crosses any other one of the data transmission lines.

8. The method of claim 7, wherein the connecting of the CPU data pins to the DRAM data pins is performed on a pin-by-pin basis without taking into account the first arrangement of the CPU data pins and the second arrangement of the DRAM data pins.

9. The method of claim 7, wherein:
the CPU data pins have different degrees of significance denoted by D0-Dn arranged in a first order, where n≧1;
the DRAM data pins also have the different degrees of significance denoted by D0-Dn but arranged in a second order different from the first order; and
at least two of the CPU data pins are respectively connected to at least two of the DRAM data pins with respective ones of the data transmission lines so that the degrees of significance of the at least two of the CPU data pins do not match the degrees of significance of respective ones of the at least two DRAM data pins.

10. The method of claim 7, wherein:
the CPU data pins have different degrees of significance denoted by D0, D1, D2, D3, D4, D5, D6, and D7 arranged in a first order;
the DRAM data pins also have the different degrees of significance denoted by D0, D1, D2, D3, D4, D5, D6, and D7 but arranged in a second order different from the first order; and
at least two of the CPU data pins are respectively connected to at least two of the DRAM data pins with respective ones of the data transmission lines so that the degrees of significance of the at least two of the CPU data pins do not match the degrees of significance of respective ones of the at least two DRAM data pins.

11. The method of claim 10, wherein:
the first order in which the different degrees of significance of the CPU data pins are arranged is D0, D1, D2, D3, D4, D5, D6, and D7; and
the second order in which the different degrees of significance of the DRAM data pins are arranged is D1, D0, D5, D4, D6, D7, D2, and D3.

12. The method of claim 10, wherein:
the CPU data pin having the degree of significance denoted by D0 is connected to one of the DRAM data pins other than the DRAM data pin having the degree of significance denoted by D0 with a respective one of the data transmission lines;
the CPU data pin having the degree of significance denoted by D1 is connected to one of the DRAM data pins other than the DRAM data pin having the degree of significance denoted by D1 with a respective one of the data transmission lines;
the CPU data pin having the degree of significance denoted by D2 is connected to one of the DRAM data pins other than the DRAM data pin having the degree of significance denoted by D2 with a respective one of the data transmission lines;
the CPU data pin having the degree of significance denoted by D3 is connected to one of the DRAM data pins other than the DRAM data pin having the degree of significance denoted by D3 with a respective one of the data transmission lines;
the CPU data pin having the degree of significance denoted by D4 is connected to one of the DRAM data pins other than the DRAM data pin having the degree of significance denoted by D4 with a respective one of the data transmission lines;
the CPU data pin having the degree of significance denoted by D5 is connected to one of the DRAM data pins other than the DRAM data pin having the degree of significance denoted by D5 with a respective one of the data transmission lines;
the CPU data pin having the degree of significance denoted by D6 is connected to one of the DRAM data pins other than the DRAM data pin having the degree of significance denoted by D6 with a respective one of the data transmission lines; and/or
the CPU data pin having the degree of significance denoted by D7 is connected to one of the DRAM data pins other than the DRAM data pin having the degree of significance denoted by D7 with a respective one of the data transmission lines.

13. The method of claim 7, wherein the data transmission lines transmit one byte of data at a time.

14. The method of claim 7, wherein the DRAM is an SDRAM.

15. A printed circuit board assembly comprising:
   a printed circuit board;
   a controller mounted on a surface of the printed circuit board, the controller comprising controller data pins having a first arrangement;
   a memory mounted on the surface of the printed circuit board on which the controller is mounted, the memory comprising memory data pins having a second arrangement different from the first arrangement; and
   data transmission lines connecting the controller data pins to the memory data pins so that none of the data transmission lines crosses any other one of the data transmission lines, the data transmission lines being provided only on the surface of the printed circuit board on which the controller and the memory are mounted.

16. The assembly of claim 15, wherein data transmission lines connect the controller data pins to the memory data pins on a pin-by-pin basis without taking into account the first arrangement of the controller data pins and the second arrangement of the memory data pins.

17. The assembly of claim 15, wherein:
   the controller data pins have different degrees of significance denoted by D0-Dn arranged in a first order, where n≧1;
   the memory data pins also have the different degrees of significance denoted by D0-Dn but arranged in a second order different from the first order; and
   at least two of the controller data pins are respectively connected to at least two of the memory data pins with respective ones of the data transmission lines so that the degrees of significance of the at least two of the controller data pins do not match the degrees of significance of respective ones of the at least two memory data pins.

18. The assembly of claim 15, wherein:
   the controller data pins have different degrees of significance denoted by D0, D1, D2, D3, D4, D5, D6, and D7 arranged in a first order;
   the memory data pins also have the different degrees of significance denoted by D0, D1, D2, D3, D4, D5, D6, and D7 but arranged in a second order different from the first order; and
   at least two of the controller data pins are respectively connected to at least two of the memory data pins with respective ones of the data transmission lines so that the degrees of significance of the at least two of the controller data pins do not match the degrees of significance of respective ones of the at least two memory data pins.

19. The assembly of claim 18, wherein:
   the first order in which the different degrees of significance of the controller data pins are arranged is D0, D1, D2, D3, D4, D5, D6, and D7; and
   the second order in which the different degrees of significance of the memory data pins are arranged is D1, D0, D5, D4, D6, D7, D2, and D3.

20. The assembly of claim 18, wherein:
   the controller data pin having the degree of significance denoted by D0 is connected to one of the memory data pins other than the memory data pin having the degree of significance denoted by D0 with a respective one of the data transmission lines;
   the controller data pin having the degree of significance denoted by D1 is connected to one of the memory data pins other than the memory data pin having the degree of significance denoted by D1 with a respective one of the data transmission lines;
   the controller data pin having the degree of significance denoted by D2 is connected to one of the memory data pins other than the memory data pin having the degree of significance denoted by D2 with a respective one of the data transmission lines;
   the controller data pin having the degree of significance denoted by D3 is connected to one of the memory data pins other than the memory data pin having the degree of significance denoted by D3 with a respective one of the data transmission lines;
   the controller data pin having the degree of significance denoted by D4 is connected to one of the memory data pins other than the memory data pin having the degree of significance denoted by D4 with a respective one of the data transmission lines;
   the controller data pin having the degree of significance denoted by D5 is connected to one of the memory data pins other than the memory data pin having the degree of significance denoted by D5 with a respective one of the data transmission lines;
   the controller data pin having the degree of significance denoted by D6 is connected to one of the memory data pins other than the memory data pin having the degree of significance denoted by D6 with a respective one of the data transmission lines; and/or
   the controller data pin having the degree of significance denoted by D7 is connected to one of the memory data pins other than the memory data pin having the degree of significance denoted by D7 with a respective one of the data transmission lines.

21. The assembly of claim 15, wherein the data transmission lines transmit one byte of data at a time.

22. The assembly of claim 15, wherein the controller is a CPU.

23. The assembly of claim 15, wherein the memory is a DRAM.

24. The assembly of claim 23, wherein the DRAM is an SDRAM.

* * * * *